United States Patent
Kosugi et al.

(10) Patent No.: US 7,256,082 B2
(45) Date of Patent: Aug. 14, 2007

(54) PRODUCTION METHOD FOR SEMICONDUCTOR DEVICE

(75) Inventors: Ryoji Kosugi, Ibaraki (JP); Kenji Fukuda, Ibaraki (JP); Junji Senzaki, Ibaraki (JP); Mitsuo Okamoto, Ibaraki (JP); Shinsuke Harada, Ibaraki (JP); Seiji Suzuki, Osaka (JP)

(73) Assignees: National Institute of Advanced Industrial Science and Technology, Tokyo (JP); Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 10/488,243

(22) PCT Filed: Sep. 10, 2002

(86) PCT No.: PCT/JP02/09219

§ 371 (c)(1),
(2), (4) Date: Jul. 21, 2004

(87) PCT Pub. No.: WO03/023864

PCT Pub. Date: Mar. 20, 2003

(65) Prior Publication Data

US 2004/0242022 A1    Dec. 2, 2004

(30) Foreign Application Priority Data

Sep. 10, 2001   (JP)   ............... 2001-274073

(51) Int. Cl.
*H01L 21/336* (2006.01)
*H01L 21/20*  (2006.01)

(52) U.S. Cl. .............. 438/192; 438/502; 438/509

(58) Field of Classification Search ........... 438/770, 438/773, 778, 787, 931, 197, 502, 509
See application file for complete search history.

(56) References Cited

U.S. PATENT DOCUMENTS

| | | | |
|---|---|---|---|
| 5,972,801 A | | 10/1999 | Lipkin et al. |
| 6,136,727 A | * | 10/2000 | Ueno ................ 438/770 |
| 6,265,326 B1 | | 7/2001 | Ueno |
| 6,365,233 B1 | * | 4/2002 | Corman et al. ........ 427/430.1 |
| 6,764,963 B2 | * | 7/2004 | Fukuda et al. ........... 438/778 |
| 6,812,102 B2 | * | 11/2004 | Fukuda et al. ........... 438/298 |
| 2002/0043691 A1 | * | 4/2002 | Higashi et al. ........... 257/368 |

FOREIGN PATENT DOCUMENTS

| | | |
|---|---|---|
| JP | 11-031691 | 2/1999 |
| JP | 11-31691 | 2/1999 |
| WO | 97/17730 | 5/1997 |

OTHER PUBLICATIONS

Katsunori Ueno, et al. "$H_2$ surface treatment for gate-oxidation of SiC metal-oxide-semiconductor field effect transisitsors", Materials Science and Engineering, vol. B61-B62, pp. 472-474 1999.

(Continued)

*Primary Examiner*—Ngân V. Ngô
(74) *Attorney, Agent, or Firm*—Oblon, Spivak, McClelland, Maier & Neustadt, P.C.

(57) ABSTRACT

A method of manufacturing a semiconductor device that provides a semiconductor device having improved channel mobility includes a process of forming a gate insulation film of silicon oxide film, silicon nitride film or silicon oxide nitride film or the like on a silicon oxide substrate, and following formation of the gate insulation film on the silicon oxide substrate with heat treatment for a given time at a temperature range of 900° C. to 1000° C. in an atmosphere containing not less than 25% $H_2O$ (water).

9 Claims, 3 Drawing Sheets

OTHER PUBLICATIONS

J.A. Cooper, et al., "SiC power electronic devices, MOSFETs and Rectifiers", Mat. Res.Soc. Symp. Proc., vol. 572, pp. 3-14 1999.

G.Y. Chung, "Improved inversion channel mobility for 4H-SiC MOSFETs fellowing high tempertaure anneals in nitric oside", IEEE Electron Device Letters, vol. 22, No. 4, pp. 176-178 2001.

L.A. Lipkin et al., Improved Oxidation Procedures for Reduced Si02/Sic Defects, Journal of Electronic Materials, 1996, vol. 25, No. 5, pp. 909 to 915.

L.A. Lipkin et al., Low Interface State Density Oxides on P-Type SiC, Materials Science Forum, 1998, vols. 264 to 268, pp. 853 to 856.

* cited by examiner

PRODUCTION METHOD FOR SEMICONDUCTOR DEVICE

TECHNICAL FIELD

The present invention relates to a method of manufacturing a field-effect transistor, a bipolar transistor, a thyristor or other such semiconductor device having a metal-insulation film (or oxide film)-semiconductor structure that uses a silicon carbide substrate.

BACKGROUND ART

Silicon carbide is a semiconductor material having excellent characteristics, such as a large band gap, high thermal conductivity, high electron saturation drift velocity and high dielectric breakdown voltage, and is drawing attention as a material for next-generation low-loss power device elements. As in the case of silicon semiconductors, thermal oxidation can be used to form an oxide film from silicon carbide, making a field-effect transistor having a metal-oxide film-semiconductor structure (MOSFET) a leading candidate for silicon carbide power device elements. But with silicon carbide substrate MOSFETs manufactured with current technology, channel mobility is far lower than the mobility predicted from the electron mobility of bulk silicon carbide. This is also the case with a MIS-type FET that uses an oxide film/nitride film/oxide film or the like as the insulation film. Considerable research has been conducted aimed at improving the channel mobility, and there are a number of proposals relating to a method of forming the oxide film/silicon carbide interface.

For example, in thermal oxidation of pyrogenic oxidation in which water is produced by the combustion of hydrogen and oxygen, JP-A HEI 11-31691 discloses a method in which the flow rate of hydrogen is increased to more than the flow ratio of 1:1 between hydrogen and oxygen. The embodiments thereof describe using this method to form a gate oxide film, decreasing the interface state density in a MOS capacitor using P-type silicon carbide.

With respect to the method of oxidizing a silicon carbide substrate, U.S. Pat. No. 5,972,801 discloses using the thermal oxidation method to form a gate oxide film in a range of 1050° C. to 1100° C., and following this by heat treatment at 600° C. to 1000° C. in an atmosphere containing $H_2O$. In the embodiments thereof, oxygen is passed through pure water heated to 95° C. (subjected to bubbling) to produce an atmosphere containing $H_2O$.

Because a conventional MIS- or MOS-type FET that uses a silicon carbide substrate has a channel mobility that is much lower than the electron mobility of bulk silicon carbide, the intrinsic properties of silicon carbide are not reflected in the device characteristics. That is, the FET On resistance ($R_{on}$) is much higher than the value that is theoretically predicted based on the property values of silicon carbide. Although silicon carbide having the crystalline structure known as 4H (4H-SiC) has a bulk electron mobility in the order of 900 $cm^2/Vs$, the channel mobility of a MOSFET formed by the usual thermal oxidation method is a very low 5 to 10 $cm^2/Vs$. To improve this, Reference 1 (K. Ueno et al., Mat. Sci. and Eng. B61-62 (1999) 472-474) relates to an improvement by using surface treatment prior to formation of the gate oxide film; Reference 2 (J. A. Cooper et al., Mat. Res. Soc. Proc. Vol. 572, pp 3-14) relates to an improvement based on the use of a low activation annealing temperature; and Reference 3 (G. Y. Chung et al., IEEE Electron Device utt. 22, 176 (2001)) relates to re-oxidation treatment in an NO (nitrous oxide) atmosphere. These references report channel mobilities in the order of 20 to 35 $cm^2/Vs$, so in view of the bulk electron mobility, dearly, there still is room for improvement.

The present invention was proposed to resolve the above problem, and has as its object to provide a method of manufacturing MIS- and MOS-type semiconductor devices with high channel mobility that use a silicon carbide substrate.

DISCLOSURE OF THE INVENTION

The present invention provides a method of manufacturing a semiconductor device that includes a process of forming a gate insulation film on a silicon carbide substrate, further comprising a process of heat treatment for a given time at a temperature of 900° C. to 1000° C. in an atmosphere containing at least 25% $H_2O$ (water), after formation of the gate insulation film on the silicon carbide substrate.

The given heat treatment time in the atmosphere containing $H_2O$ is from 1 to 5 hours.

The gate insulation film is silicon oxide film, silicon nitride Mm or silicon oxide nitride film, or a multilayer film that includes one of these films.

The gate insulation film is a film formed by a thermal oxidation method or a deposition method, or by a method that is a combination of those methods.

The thermal oxidation method uses an atmosphere of dry oxygen.

The atmosphere containing $H_2O$ (water) further contains one or both of $O_2$ (oxygen) gas and an inert gas.

The $H_2O$ (water) contained in the atmosphere containing $H_2O$ (water) is produced by thermal reaction of $H_2$ (hydrogen) gas and $O_2$ (oxygen) gas.

The method of manufacturing a semiconductor device according to the present invention further comprises a group of processes that are conducted after the heat treatment process in the atmosphere containing $H_2O$ and that adopt a maximum temperature of 800° C.

The silicon carbide substrate has a (000-1) plane orientation.

The channel mobility of the semiconductor device thus manufactured can be substantially improved by heat treatment at a temperature of 900° C. to 1000° C. in an atmosphere containing $H_2O$ after the gate insulation film has been formed on the silicon carbide semiconductor substrate, as described above.

BEST MODE FOR CARRYING OUT THE INVENTION

In a method of manufacturing a semiconductor device that includes a process of forming a gate insulation film on a silicon carbide substrate, this invention comprises following the process of forming the gate insulation film on the silicon carbide substrate with heat treatment in an atmosphere containing $H_2O$ in order to improve the channel mobility of the manufactured FET.

The above heat treatment in an atmosphere containing $H_2O$ is carried out after formation of the gate insulation film. However, the effect of the heat treatment also depends on gate insulation film formation conditions (temperature, atmosphere and so forth), and if the conditions are different, there may be cases in which no improvement in channel mobility is seen. Also, in the heat treatment of the present invention, in addition to the moisture concentration of the atmosphere containing $H_2O$, there are clear ranges at which conditions relating to heat treatment temperature and heat treatment time are optimal, and improvement in channel mobility may not be seen in cases where there is deviation from these conditions. This behavior is different from that discussed with reference to interface state density in the prior art.

Figure 1:
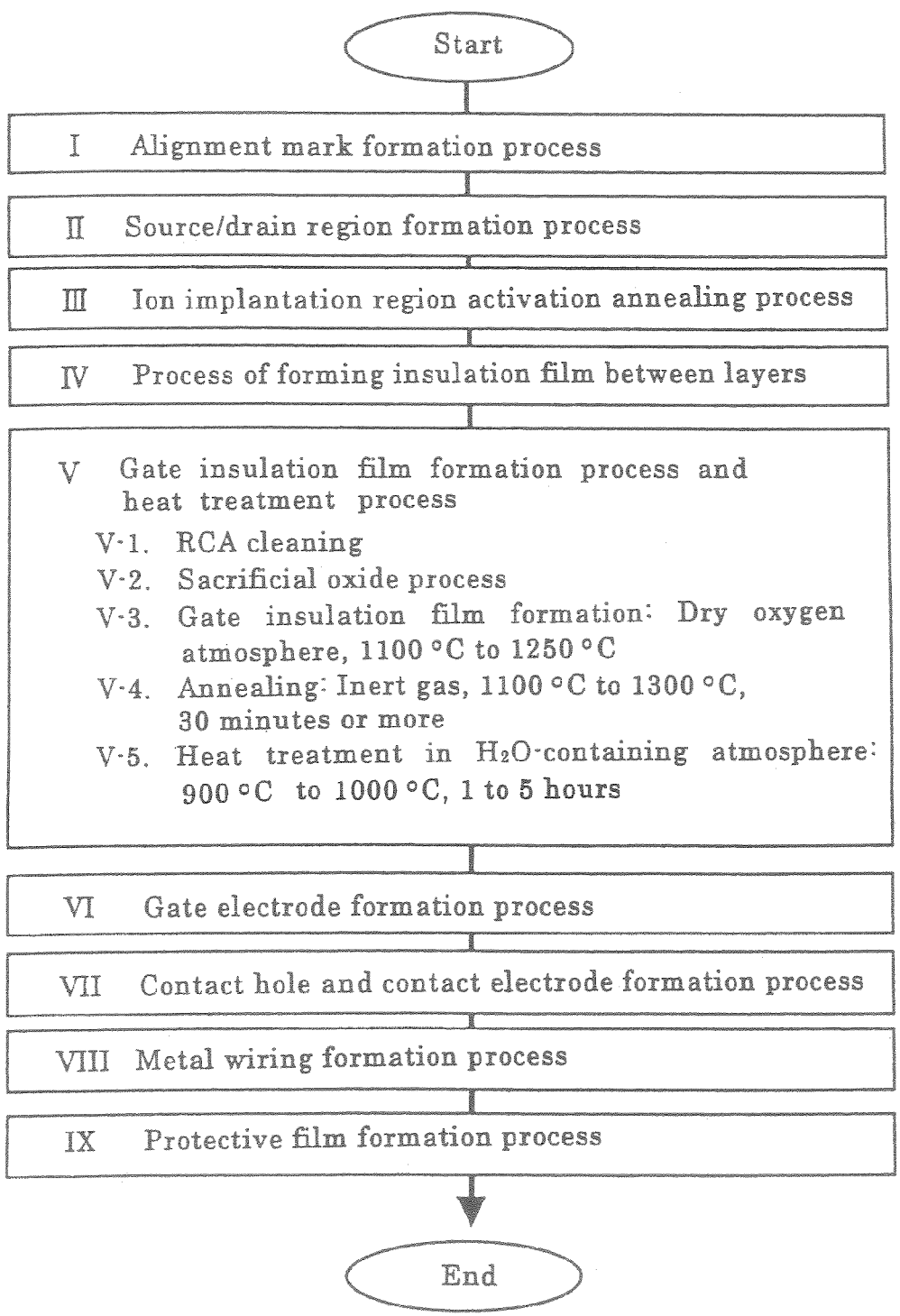
FIG. 1 is a flow chart showing the process of manufacturing a MOSFET according to the present invention.

In the following, details of an aspect of an embodiment of the invention are described, with reference to the flow chart of FIG. 1 showing the procedure of manufacturing a MOS-type FET.

Figure 5:
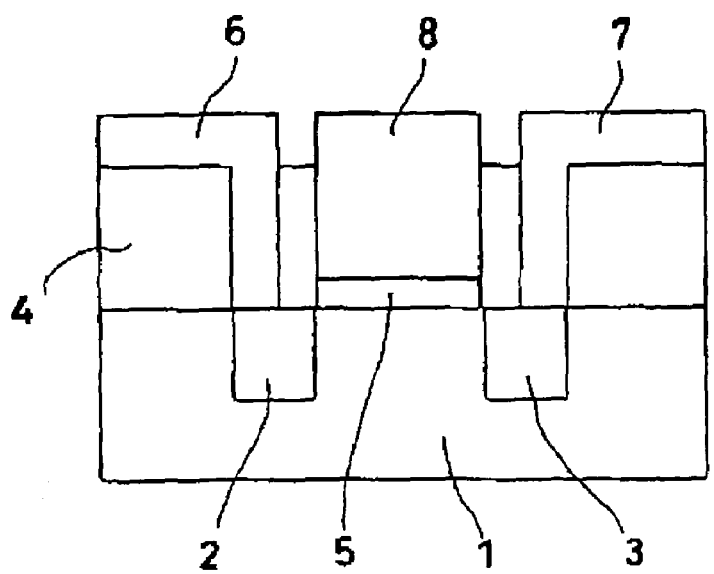
FIG. 5 is a cross-sectional diagram of a MOS-type semiconductor device according to an embodiment of the present invention.

FIG. 5 shows an example of a MOS-type FET using a silicon carbide substrate, manufactured in accordance with the invention. With reference to the drawing, a source region 2 and a drain region 3 are provided in a silicon carbide substrate 1 as sp aced by a channel region from each other. A gate insulation film 5 is provided on the channel region, and a gate electrode 8 is provided on the gate insulation film 5.

The source region 2 is electrically connected to a source electrode 6 and the drain region 3 is electrically connected to a drain electrode 7, and the source electrode 6, drain electrode 7 and gate electrode are each insulated by an insulation film 4.

The MOS-type FET shown in FIG. 5 was actually fabricated and the mutual conductance ($G_m$)-gate voltage ($V_g$) properties used to investigate the dependency of the field-effect channel mobility ($\mu_{FE}$) in the linear region (drain voltage $V_d$=0.1 V) on the gate insulation film formation method and subsequent beat treatment process. As the silicon carbide substrate 1, there were used two types of substrate: a P-type 4H-SiC (0001) epitaxial substrate (having a difference of approximately $5 \times 10^{15}$ cm$^{-3}$ between acceptor density Na and donor density), and a P-type 6H-SiC (0001) epitaxial substrate (having a difference of approximately $5 \times 10^{15}$ cm$^{-3}$ between acceptor density Na and donor density). During fabrication of all samples, temperatures were raised and lowered at ±5° C./minute. Specific details of the processes of manufacturing the MOS-type FETs will now be described, in the order shown in FIG. 1.

I). Alignment mark formation process:
- I-1. The silicon carbide substrate is cleaned using RCA cleaning.
- I-2. Photolithography is carried out to form alignment marks used for photolithography.
- I-3. RIE (reactive ion etching) is used to form alignment marks.

II). Source/drain region formation process:
- II-1. Deposition is used to form an oxide film for an ion implantation mask for the source/drain regions.
- II-2. After source/drain region photolithography, dry etching or BHF (buffered hydrofluoric acid) is used to etch the deposited oxide film and expose the ion-implanted source/drain regions.
- II-3. Nitrogen, phosphorus or arsenic ions are implanted at a substrate temperature of 500° C. to 1200° C. to form the source/drain regions. In this example, phosphorus ions were implanted at a substrate temperature of 500° C.

III). Ion implantation region activation annealing process:
- III-1. In an inert gas atmosphere, activation annealing is performed at a temperature range of 1100° C. to 2000° C. In this example, activation annealing was performed at 1500° C. for 5 minutes.

IV). Process of forming insulation film between layers:
- IV-1. Inter-layer oxide insulation film is formed by the deposition method.
- IV-2. After photolithography of the element formation region (active region), dry etching or BHF is used to etch the deposited oxide film and expose the active region.

V). Gate insulation film formation process and heat treatment process:
- V-1. The substrate is cleaned using RCA cleaning.
- V-2. (Sacrifice) oxide film is formed on the substrate by thermal oxidation, and diluted hydrofluoric acid is used to remove the oxide film (sacrificial oxide process).
- V-3. Gate insulation film is formed at 1100° C. to 1250° C. using the thermal oxidation method or deposition method, or a combination of both. In the example, as the gate insulation film, a silicon oxide film approximately 42 nm thick was formed by thermal oxidation at 1200° C. in a dry oxygen atmosphere.

Silicon oxide film is mentioned as a typical gate insulation film. However, since an extremely thin silicon oxide film is known to exist in the interface between the semiconductor substrate and the gate insulation film, a silicon nitride film or silicon oxide nitride film may also be used. Also, using a multilayer film that includes silicon oxide film, silicon nitride film or silicon oxide nitride film has the effect of increasing the long-term reliability of the gate insulation film.

- V-4. After the gate insulation film has been formed, if required it can be annealed for 30 minutes or more at 1100° C. to 1300° C. in an inert gas. In the example, annealing was performed in argon for 30 minutes at 1200° C.
- V-5. Heat treatment in an atmosphere containing at least 25% $H_2O$ was performed at a temperature range of 900° C. to 1000° C. for between 1 hour and 5 hours. In the example, it was performed at 950° C. for 3 hours.

There are a number of methods of creating an atmosphere containing $H_2O$. In this example, the atmosphere containing $H_2O$ was produced by the thermal reaction (the pyrogenic method) of $H_2$ (hydrogen) and $O_2$ (oxygen), which facilitates controlling the $H_2O$ concentration. By including oxygen or inert gas in the atmosphere, the moisture concentration is readily controlled. In the example, Ar gas was introduced. The $[H_2]/[O_2]$ ratio between Ha gas flow rate $[H_2]$ and $O_2$ gas flow rate $[O_2]$ was varied within the range 0 to ⅔, which corresponds to a moisture concentration of 0% to 50%.

VI). Gate electrode formation process:
- VI-1. The gate electrode can be a metal film, such as aluminum (Al) or molybdenum (Mo); a silicide film, such as W (tungsten)-$Si_2$ film, Mo—$Si_2$ film or Ti (titanium)-Si film; or an N-type or P-type silicon gate electrode. The temperature at which a metal gate electrode is formed on the substrate, while depending on the metal used, is not higher than 500° C. In the case of a silicon gate, the temperature is 500° C. to 800° C. In the example, an Al electrode was formed through the resistance heating method.
- VI-2. After gate electrode photolithography, the gate electrode is formed through etching of the electrode formed in VI-1.

VII). Contact Hole and Contact Electrode Formation Process:
- VII-1. Dry etching or wet etching is used to form contact holes in the insulation film over the source/drain regions.
- VII-2. Immediately after forming the contact holes, a film composed of a metal, such as Ni, Ti or Al, or of laminated layers thereof, is formed by vapor deposition and photolithography is used to form contact electrodes. Also, if necessary, annealing at around 800° C. is performed in an inert gas atmosphere.

VIII). Metal wiring formation process:
- VIII-1. A film of a metal, such as Ni, Ti or Al, or of a lamination thereof, is formed. In the example, it was formed of Al using resistance heating.
- VIII-2. Metal wires are formed by dry etching or wet etching the above laminated film. In this example, after deposition of Al using resistance heating, wet etching was used.
- VIII-3. If required, the formed metal wiring is heat-treated in an inert gas atmosphere.

IX). Protective film formation process:
- IX-1. After completing the formation of contact electrodes and metal wiring, a low-temperature CVD process is used to form a protective film of silicon oxide thereon at a temperature not higher than 400° C.

The above is the procedure used when self-alignment is not used. If self-alignment is used, the procedure will comprise alignment mark formation process I, process II of forming insulation film between layers, gate insulation film formation process and heat treatment process III, gate electrode formation process IV, source/drain region formation process V, ion implantation region activation annealing process VI, contact hole and contact electrode formation process VII, metal wiring formation process VIII, and protective film formation process IX.

Typical respective process conditions pertaining to the following processes are shown below, which processes are gate insulation layer formation 1, annealing 2 in inert gas and heat treatment 3 in $H_2O$-containing atmosphere.

1. Gate insulation layer formation: 140 minutes at 1200° C. in dry oxygen atmosphere,
2. Post-annealing in inert gas: 30 minutes at 1200° C. in argon gas, and
3. Heat treatment in $H_2O$-containing atmosphere: Pyrogenic oxidation conditions are $[H_2]/[O_2]=0$ to $\frac{2}{3}$, substrate temperature of 950° C. and heat treatment time of 180 minutes.

Figure 2:
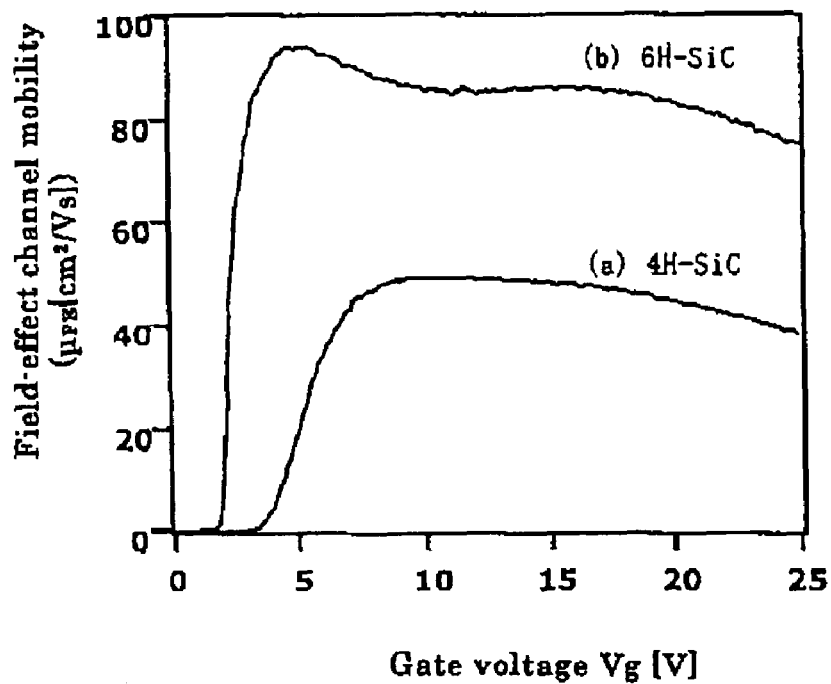
FIG. 2 is a diagram showing the gate voltage dependency of the field-effect mobility of a MOSFET manufactured by the method of the present invention.

In FIG. 2 is a diagram showing the gate voltage dependency of the field-effect channel mobility of a MOSFET manufactured by the method of above-described example.

In FIG. 2, curve (a) is the channel mobility of a MOSFET (MOSFET (a)) fabricated using a 4H-SiC (0001) substrate, and curve (b) is the channel mobility of a MOSFET (MOSFET (b)) fabricated using a 6H-SiC (0001) substrate.

In each case, the MOSFET heat treatment conditions, as described in V-4, were 950° C. for 3 hours, in an atmosphere with a moisture concentration of 50% ($H_2O_2$=0 to $\frac{2}{3}$).

As can be clearly seen from FIG. 2, the channel mobility of MOSFET (a) was approximately 50 $cm^2/Vs$ and the channel mobility of MOSFET (b) was approximately 95 $cm^2/Vs$.

Also, as can be seen from FIG. 2, in the MOSFETs, whichever the substrate used, the decrease from the maximum channel mobility value $\mu_{FEmax}$ to the high gate voltage side (25 V) was small, being in the order of 20%. The maximum value $\mu_{FEmax}$ in the case of a gate insulation film formed by the usual thermal oxidation method is 5 to 10 $cm^2/Vs$ in the case of a MOSFET with a 4H-SiC (0001) substrate, and 35 $cm^2/VS$ in the case of a MOSFET with a 6H-SiC (0001) substrate, from which it can be seen that with both MOSFETs (a) and (b) manufactured by the method of this invention, major increases in channel mobility $\mu_{FE}$ were achieved. These increases in the channel mobility $\mu_{FE}$ were also confirmed in MOSFETs using 4H-SiC (000-1) and 6H-SiC (000-1) substrates. In particular, it was confirmed that the use of a (000-1) substrate improved channel mobility over a wide temperature range from 800° C. to 1100° C.

Figure 3:
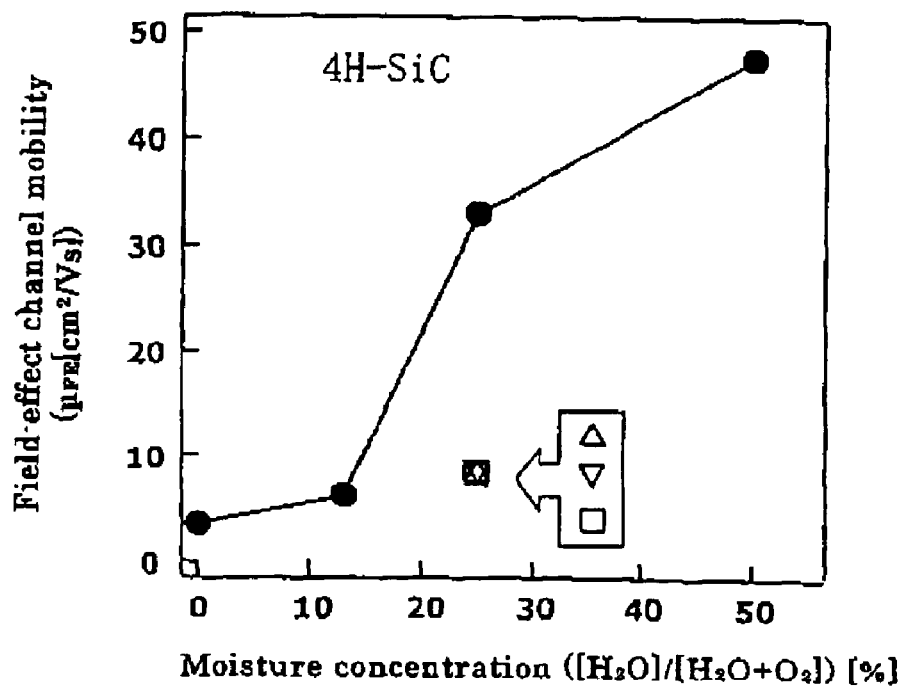
FIG. 3 is a diagram showing the heat-treatment moisture concentration dependency of the maximum field-effect channel mobility of a MOSFET using a 4H-SiC (0001) substrate manufactured by the method of the present invention.

FIG. 3 is a diagram showing the heat-treatment moisture concentration dependency of the maximum field-effect channel mobility of a MOSFET manufactured using a 4H-SiC (0001) substrate. In FIG. 3, the solid bullets (●) are plot points representing the maximum MOSFET channel mobility value $\mu_{FEmax}$ at a moisture concentration in the heat-treatment atmosphere of 0% (corresponding to annealing in a dry oxygen atmosphere), 13%, 25%, and 50%. As is clear from the figure, the maximum $\mu_{FEmax}$ value of the fabricated MOSFETs increases with the increase in the moisture concentration, with the increase in the maximum $\mu_{FEmax}$ value being particularly pronounced in the case of MOSFETs fabricated in an atmosphere having a moisture concentration of 25% or more.

For reference, the channel mobilities of MOSFETs fabricated in the above process using heat treatment for 180 minutes at 850° C. (Δ) or 1050° C. (∇) in an atmosphere containing 25% $H_2O$, and MOSFETs thus fabricated using heat treatment for 60 minutes at 950° C. in an atmosphere containing 25% $H_2O$ (□) are shown. In these FETs, the maximum channel mobility was low, being in the order of 8 $cm^2/Vs$.

Such maximum channel mobility is substantially the same as that obtained using a gate insulation film formed using just the ordinary thermal oxidation.

Figure 4:
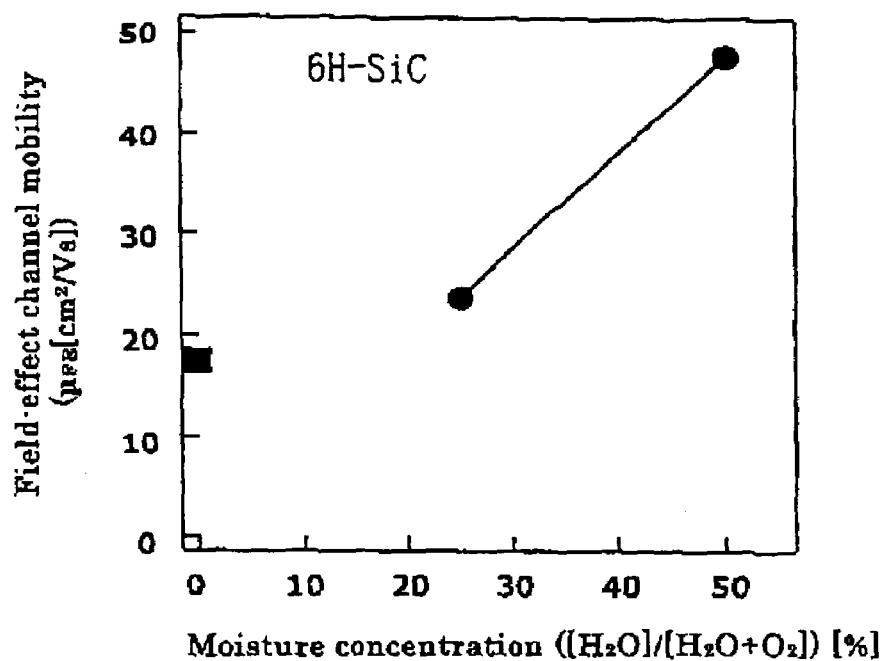
FIG. 4 is a diagram showing the heat-treatment moisture concentration dependency of the maximum field-effect channel mobility of a MOSFET using a 6H-SiC (0001) substrate manufactured by the method of the present invention.

In FIG. 4, the solid bullets (●) are plot points representing the maximum channel mobility value $\mu_{FEmax}$ of a MOSFET using a 6H-SiC (0001) substrate fabricated at a moisture concentration in the heat-treatment atmosphere of 25% and 50%, The solid squares (■) in the figure denote the values of a MOSFET not subjected to heat treatment in an $H_2O$-containing atmosphere after formation of the gate insulation film by thermal oxidation. From the figure, it can be seen that even in the case of a MOSFET that uses a 6H-SiC (0001) substrate, compared to the maximum channel mobility of a MOSFET that uses a gate oxide film formed by ordinary thermal oxidation, an increase in the moisture concentration of the atmosphere is accompanied by a major increase in mobility.

In particular, the channel mobility was approximately 97 cm$^2$/Vs in the case of a MOSFET manufactured using an atmosphere having a moisture concentration of 50%.

In the method of manufacturing a semiconductor device according to the present invention, the processes after the heat treatment in an H$_2$O-containing atmosphere does not include a process at or above a temperature of 800° C., and as a result, fabrication of the semiconductor device can be completed in a state in which the increase in channel mobility resulting from the heat treatment in an H$_2$O-containing atmosphere is maintained. When the processes following the heat treatment in the H$_2$O-containing atmosphere included a process at or above the heat treatment temperature, it was confirmed that the effect was reduced. To take one example, in the case of a MOSFET using a 6H-SiC (0001) substrate that was subjected to heat treatment at 1000° C. for 2 minutes after the heat treatment in an H$_2$O-containing atmosphere, channel mobility decreased from 95 cm$^2$/Vs to around 70 cm$^2$Vs. However, the effect is not completely extinguished.

The above embodiment was described with reference to a basic transverse type MOS-type FET. However, the method of manufacturing a semiconductor device in accordance with this invention can also be applied with the same effect to other semiconductor devices, such as a vertical type MOS- (MIS-)type FET, an insulated gate bipolar transistor (IGBT) and a MOS-type thyristor.

INDUSTRIAL APPLICABILITY

As described in the foregoing, in a process of manufacturing a MIS- or MOS-type FET using a silicon carbide substrate, in accordance with this invention, a MIS- or MOS-type semiconductor device having high channel mobility can be realized by, after forming the gate insulation film, using heat treatment for a given time in a water-containing atmosphere.

Also, channel mobility can be improved by using heat treatment at a temperature of 900° C. to 1000° C. in an atmosphere containing H$_2$O (water) after forming a gate insulation film composed of a single or multiple layers of silicon oxide film, silicon nitride film or silicon oxide nitride film used in a transistor or the like on a silicon carbide region.

The invention claimed is:

1. A method for fabricating a semiconductor device comprising:
   forming a gate insulation film on a silicon carbide substrate; and
   heat-treating the gate insulation film for 1 to 5 hours at a temperature of 900° C. to 1000° C. in an atmosphere containing at least 25% water.

2. The method of manufacturing a semiconductor device according to claim 1, wherein the gate insulation film is silicon oxide film, silicon nitride film or silicon oxide nitride film.

3. The method of manufacturing a semiconductor device according to claim 1, wherein the gate insulation film is a multilayer film that includes silicon oxide film, silicon nitride film or silicon oxide nitride film.

4. The method of manufacturing a semiconductor device according to claim 1, wherein the gate insulation film is a film formed by a thermal oxidation method or a deposition method, or by a method that is a combination of those methods.

5. The method of manufacturing a semiconductor device according to claim 4, wherein the thermal oxidation method uses an atmosphere of dry oxygen.

6. The method of manufacturing a semiconductor device according to claim 1, wherein the atmosphere containing water further contains one or both of O$_2$ (oxygen) gas and an inert gas.

7. The method of manufacturing a semiconductor device according to claim 1, wherein the water contained in the atmosphere containing water is produced by thermal reaction of H$_2$ (hydrogen) gas and O$_2$ (oxygen) gas.

8. The method of manufacturing a semiconductor device according to claim 1, further comprising a group of processes that are conducted after the heat treatment process in the atmosphere containing water and that adopt a maximum temperature of 800° C.

9. The method of manufacturing a semiconductor device according to claim 1, wherein the silicon oxide substrate is formed thereon with a silicon oxide region having a (000-1) plane orientation.

* * * * *